US012658414B2

(12) United States Patent
Matsumoto et al.

(10) Patent No.:  US 12,658,414 B2
(45) Date of Patent:  Jun. 16, 2026

(54) DETECTION METHOD AND PLASMA PROCESSING APPARATUS

(71) Applicant: Tokyo Electron Limited, Tokyo (JP)

(72) Inventors: Naoki Matsumoto, Kurokawa-gun (JP);
Toshihisa Ozu, Kurokawa-gun (JP);
Satoru Nakamura, Kurokawa-gun (JP);
Yusuke Shimizu, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 339 days.

(21) Appl. No.: 18/225,045

(22) Filed: Jul. 21, 2023

(65) Prior Publication Data

US 2024/0030012 A1    Jan. 25, 2024

(30) Foreign Application Priority Data

Jul. 22, 2022    (JP) ................................. 2022-117551
Jun. 22, 2023    (JP) ................................. 2023-102545

(51) Int. Cl.
H01J 37/32       (2006.01)
G01M 3/00        (2006.01)
G01N 25/72       (2006.01)

(52) U.S. Cl.
CPC ....... H01J 37/32935 (2013.01); G01M 3/002 (2013.01); G01N 25/72 (2013.01)

(58) Field of Classification Search
None
See application file for complete search history.

(56) References Cited

U.S. PATENT DOCUMENTS

2005/0207088 A1* 9/2005 Nishimoto .......... H01L 21/6831
361/234
2006/0113037 A1* 6/2006 Nishio .............. H01J 37/32082
156/345.44
2006/0238953 A1* 10/2006 Hanawa .............. H01L 21/6831
361/234
2018/0350569 A1* 12/2018 Kaneko ............... H01L 21/3065

FOREIGN PATENT DOCUMENTS

JP            2013-033726 A     2/2013

* cited by examiner

*Primary Examiner* — Erica S Lin
(74) *Attorney, Agent, or Firm* — PROCOPIO, CORY, HARGREAVES & SAVITCH LLP

(57) ABSTRACT

The present disclosure provides a detection method implemented in a plasma processing apparatus. The plasma processing apparatus comprising a plasma processing chamber, a substrate support disposed in the plasma processing chamber and a plurality of heaters disposed in the substrate support, the detection method comprising: disposing a substrate on the substrate support; performing plasma processing by generating plasma in the plasma processing chamber; measuring temperatures of each of the plurality of heaters with a plasma being formed in the plasma processing chamber; and detecting a significant point in the substrate support based on the measured temperatures of the plurality of heaters.

15 Claims, 15 Drawing Sheets

Fig. 11

$$q_h = q_{h0} - q_P - \frac{R_{th} \cdot A \cdot q_P}{R_{thc} \cdot A \cdot (\lambda_1 - \lambda_2)} \left\{ \left( 1 + \frac{a_2 + a_3}{a_1 \cdot a_3} \cdot \lambda_2 \right) (a_1 + \lambda_1) \exp\left( -\frac{t}{\tau_1} \right) \right.$$

$$\left. - \left( 1 + \frac{a_2 + a_3}{a_1 \cdot a_3} \cdot \lambda_1 \right) (a_1 + \lambda_2) \exp\left( -\frac{t}{\tau_2} \right) \right\} \quad \cdots (1)$$

$$q_h = \frac{P_h}{A} \quad \cdots (2)$$

$$q_{h0} = \frac{P_{h0}}{A} \quad \cdots (3)$$

$$R_{thc} \cdot A = \frac{z_c}{\kappa_c} \quad \cdots (4)$$

$$a_1 = \frac{1}{\rho_w \cdot C_w \cdot z_w \cdot R_{th} \cdot A} \quad \cdots (5)$$

$$a_2 = \frac{2}{\rho_c \cdot C_c \cdot z_c \cdot R_{th} \cdot A} \quad \cdots (6)$$

$$a_3 = \frac{2}{\rho_c \cdot C_c \cdot z_c \cdot R_{thc} \cdot A} \quad \cdots (7)$$

$$\lambda_1 = \frac{1}{2} \left\{ -(a_1 + a_2 + a_3) + \sqrt{(a_1 + a_2 + a_3)^2 - 4a_1 a_3} \right\} \quad \cdots (8)$$

$$\lambda_2 = \frac{1}{2} \left\{ -(a_1 + a_2 + a_3) - \sqrt{(a_1 + a_2 + a_3)^2 - 4a_1 a_3} \right\} \quad \cdots (9)$$

$$\tau_1 = -\frac{1}{\lambda_1} \quad \cdots (10)$$

$$\tau_2 = -\frac{1}{\lambda_2} \quad \cdots (11)$$

Fig. 12

$$T_w = T_b + q_p \cdot (R_{tb} \cdot A + R_{inc} \cdot A)$$

$$+ \frac{q_p}{\rho_w \cdot C_w \cdot z_w \cdot (\lambda_1 - \lambda_2)} \left\{ \left( 1 + \frac{a_2 + a_3}{a_1 \cdot a_3} \cdot \lambda_2 \right) \exp\left( -\frac{t}{\tau_1} \right) \right.$$

$$\left. - \left( 1 + \frac{a_2 + a_3}{a_1 \cdot a_3} \cdot \lambda_1 \right) \exp\left( -\frac{t}{\tau_2} \right) \right\} \quad \cdots (12)$$

Fig. 13

$$T_w = T_b + q_p \cdot (R_{th} \cdot A + R_{thc} \cdot A) \qquad \cdots (13)$$

DETECTION METHOD AND PLASMA PROCESSING APPARATUS

CROSS-REFERENCE TO RELATED APPLICATION

The present application claims priority under 35 U.S.C. § 119 to Japanese Patent Application No. 2022-117551 filed on Jul. 22, 2022 and Japanese Patent Application No. 2023-102545 filed on Jun. 22, 2023, the entire contents of which are incorporated herein by reference.

BACKGROUND

Field

Exemplary embodiments of the present disclosure relate to a detection method and a plasma processing apparatus.

Description of Related Art

Japanese Patent Application Laid-Open No. 2013-033726 discloses a technique for improving a determining accuracy of abnormal electric discharge.

SUMMARY

In one exemplary embodiment, a detection method implemented in a plasma processing apparatus is provided. The plasma processing apparatus comprising a plasma processing chamber, a substrate support disposed in the plasma processing chamber and a plurality of heaters disposed in the substrate support, the detection method comprising: disposing a substrate on the substrate support; performing plasma processing by generating plasma in the plasma processing chamber; measuring temperatures of each of the plurality of heaters with a plasma being formed in the plasma processing chamber; and detecting a significant point in the substrate support based on the measured temperatures of the plurality of heaters.

BRIEF DESCRIPTION OF DRAWINGS

FIG. 11 shows examples of equations used in this processing method.

FIG. 12 shows an example of an equation used in this processing method.

FIG. 13 shows an example of an equation used in this processing method.

DETAILED DESCRIPTION

Figure 1:
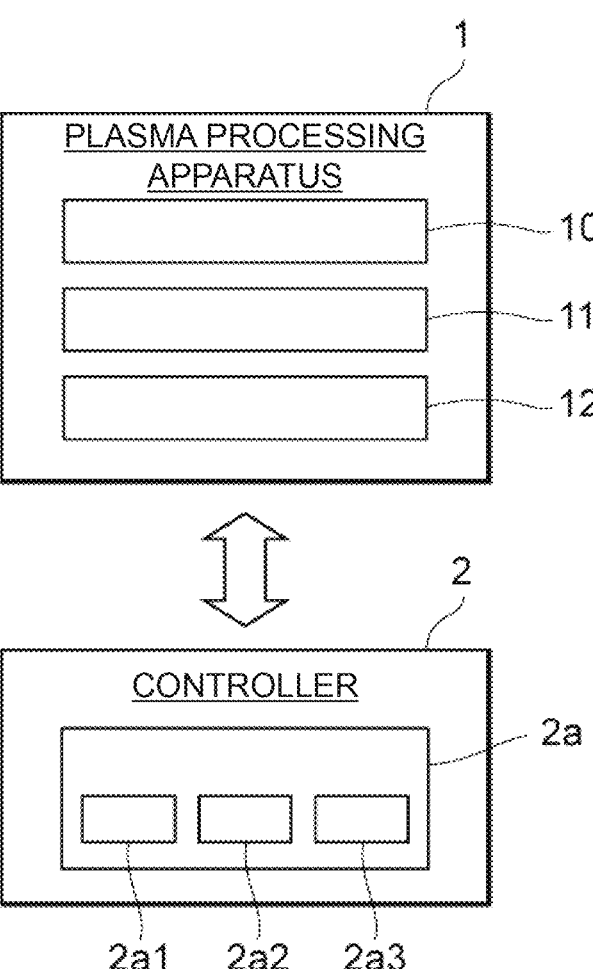
FIG. 1 illustrates an example configuration of a plasma processing system.

Hereinafter, each embodiment of the present disclosure will be described.

In one exemplary embodiment, a detection method implemented in a plasma processing apparatus is provided. The plasma processing apparatus comprising a plasma processing chamber, a substrate support disposed in the plasma processing chamber and a plurality of heaters disposed in the substrate support, the detection method comprising: disposing a substrate on the substrate support; performing plasma processing by generating plasma in the plasma processing chamber; measuring temperatures of each of the plurality of heaters with a plasma being formed in the plasma processing chamber; and detecting a significant point in the substrate support based on the measured temperatures of the plurality of heaters.

In one exemplary embodiment, the detection method further comprises; notifying of the significant point.

In one exemplary embodiment, the detection method further comprises presetting a temperature threshold for each of the plurality of heaters, wherein, in detecting the significant point, the significant point is detected by comparing the measured temperature of each of the plurality of heaters with the threshold preset for each of the plurality of heaters.

In one exemplary embodiment, the detection method further comprises associating the significant point with a parameter related to the plasma processing.

In one exemplary embodiment, the substrate has a front surface and a back surface, and in disposing the substrate, the substrate is disposed on the substrate support such that the back surface contacts the substrate support, the detection method further comprises: supplying a heat transfer gas to a gap between back surface and the substrate support with the substrate being disposed on the substrate support; and measuring an amount of leakage of the heat transfer gas into the plasma processing chamber with the heat transfer gas being supplied.

In one exemplary embodiment, associating includes associating the leak of the heat transfer gas with the significant point when the amount of leakage of the heat transfer gas exceeds a preset threshold.

In one exemplary embodiment, associating the significant point with the parameter of the plasma processing includes notifying the association of the leak of the heat transfer gas with the significant point.

In one exemplary embodiment, wherein performing plasma processing includes forming the plasma by supplying one or more RF signals to one or more electrodes, and wherein, in associating the significant point with the parameter of the plasma processing, the parameter related to the plasma processing includes reflected power of the one or more RF signals reflected at the one or more electrodes.

In one exemplary embodiment, performing plasma processing includes forming a plasma by supplying one or more RF signals to one or more electrodes, wherein, in associating the significant point with the parameter of the plasma processing, the parameter related to the plasma processing includes a voltage of the one or more RF signals.

In one exemplary embodiment, in associating the significant point with the parameter of the plasma processing, the parameter related to the plasma processing includes a difference between a maximum voltage and a minimum voltage of the one or more RF signals.

In one exemplary embodiment, disposing the substrate includes disposing the substrate on the substrate support with a lift pin, and associating the significant point with the parameter of the plasma processing, the parameter related to the plasma processing includes notifying the association of a position of the lift pin with the significant point.

In one exemplary embodiment, the one or more of the RF signals include at least one of a source RF signal or a bias RF signal.

In one exemplary embodiment, the one or more electrodes include at least one of an upper electrode or a lower electrode.

In one exemplary embodiment, a plasma processing apparatus is provided. The plasma processing apparatus comprises: a plasma processing chamber; a substrate support disposed in the plasma processing chamber; a plurality of heaters disposed in the substrate support; and a controller, wherein the controller executes controls of disposing a substrate on the substrate support, performing plasma processing by generating plasma in the plasma processing chamber, measuring temperatures of each of the plurality of heaters with a plasma being formed in the plasma processing chamber, and detecting a significant point in the substrate support based on the measured temperatures of the plurality of heaters.

Hereinafter, each embodiment of the present disclosure will be described in detail with reference to the drawings. In each drawing, the same or similar elements will be given the same reference numerals, and repeated descriptions will be omitted. Unless otherwise specified, a positional relationship such as up, down, left, and right will be described based on a positional relationship illustrated in the drawings. A dimensional ratio in the drawings does not indicate an actual ratio, and the actual ratio is not limited to the ratio illustrated in the drawings.

FIG. 1 is a view for explaining an example of a configuration of a capacitively-coupled plasma processing system. In one embodiment, the plasma processing system includes a plasma processing apparatus 1 and a controller 2. The plasma processing system is an example of a substrate processing system and the plasma processing apparatus 1 is an example of a substrate processing apparatus. The plasma processing apparatus 1 includes a plasma processing chamber 10, a substrate support 11 and a plasma generator 12. The plasma processing chamber 10 has a plasma processing space. Further, the plasma processing chamber 10 has at least one gas supply port for supplying at least one processing gas into the plasma processing space, and at least one gas exhaust port for exhausting the gas from the plasma processing space. The gas supply port is connected the gas supply 20 to be described below, and the gas exhaust port is connected to the exhaust system 40 to be described below. The substrate support 11 is disposed in the plasma processing space and has a substrate support surface for supporting a substrate.

The plasma generator 12 is configured to generate plasma from at least one processing gas supplied into the plasma processing space. The plasma formed in the plasma processing space may be Capacitive Coupled Plasma (CCP), Inductively Coupled Plasma (ICP), Electron-Cyclotron-resonance (ECR) plasma, Helicon Wave Plasma (HWP) or Surface Wave Plasma (SWP). Further, various types of plasma generator including Alternative Current (AC) plasma generator and Direct Current (DC) plasma generator may be used. In one embodiment, an AC signal (AC power) used in the AC plasma generator may have a frequency in the range of 100 kHz to 10 GHz. Accordingly, an AC signal may include Radio Frequency (RF) signal and Microwave signal. In one embodiment, an RF signal may have a frequency in the range of 100 kHz to 150 MHz.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include a processor $2a1$, a storage unit $2a2$, and a communication interface $2a3$. The controller 2 is implemented by, for example, a computer $2a$. The processor $2a1$ may be configured to read a program from the storage unit $2a2$ and perform various control operations by executing the read program. The program may be stored in advance in the storage unit $2a2$, or may be acquired via a medium when necessary. The acquired program is stored in the storage unit $2a2$, and is read from the storage unit $2a2$ and executed by the processor $2a1$. The medium may be various storing media readable by the computer $2a$, or may be a communication line connected to the communication interface $2a3$. The processor $2a1$ may be a Central Processing Unit (CPU). The storage $2a2$ may include a random access memory (RAM), a read only memory (ROM), a hard disk drive (HDD), a solid state drive (SSD), or a combination thereof. The communication interface $2a3$ may communicate with the plasma processing apparatus 1 via a communication line such as a local area network (LAN).

Figure 2A:
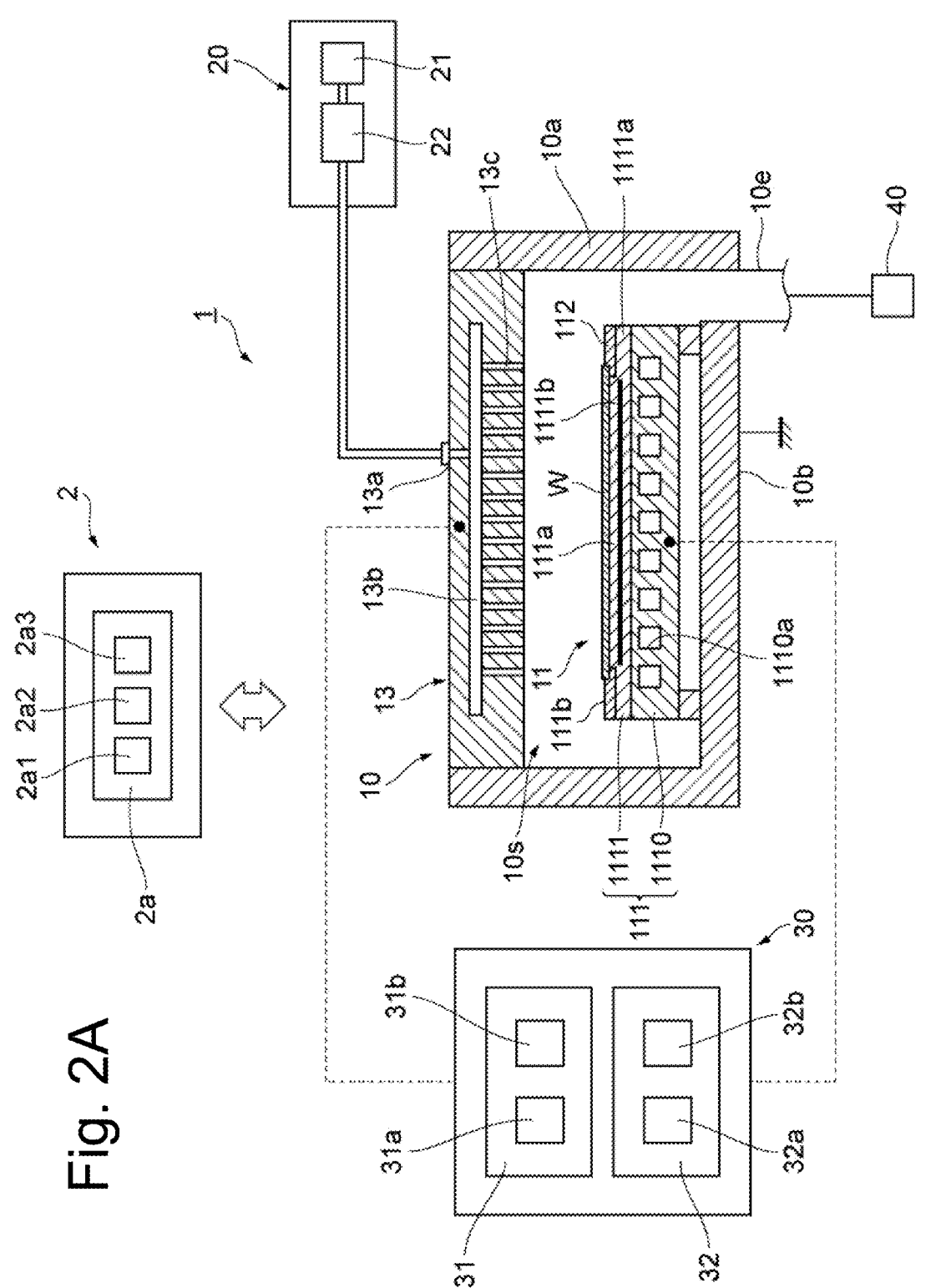
FIG. 2A illustrates an example configuration of a capacitively coupled plasma processing apparatus.
Figure 2B:
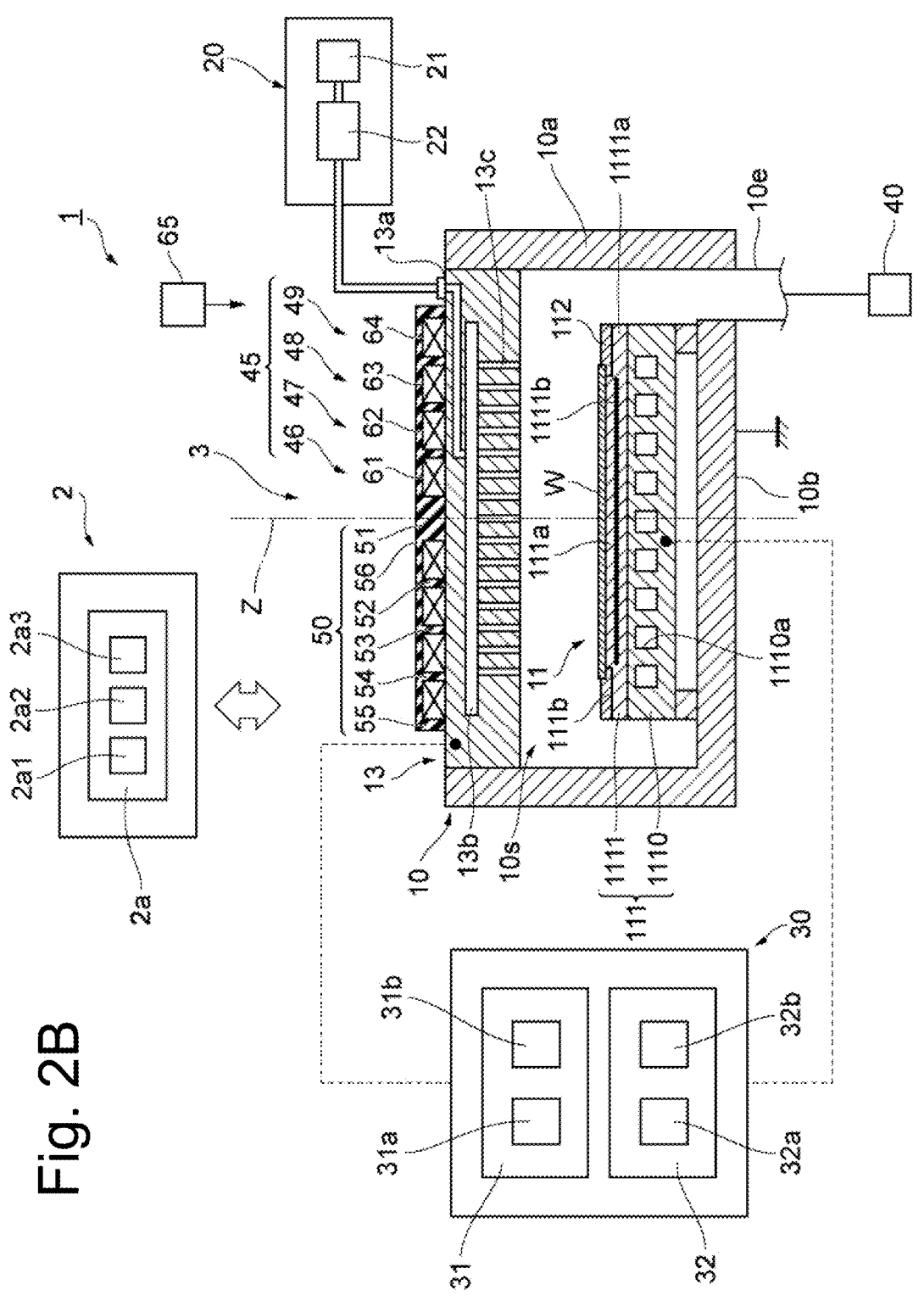
FIG. 2B illustrates an example configuration of a capacitively coupled plasma processing apparatus.

Hereinafter, an example of the configuration example of a plasma processing apparatus will be described. FIGS. 2A and 2B are views for explaining an example of a configuration of a capacitively-coupled plasma processing apparatus.

The capacitively-coupled plasma processing apparatus 1 includes a plasma processing chamber 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space $10s$ defined by the shower head 13, a sidewall $10a$ of the plasma processing chamber 10, and the substrate support 11. The plasma processing chamber 10 is grounded. The shower head 13 and the substrate support 11 are electrically insulated from a housing of the plasma processing chamber 10.

The substrate support 11 includes a main body 111 and a ring assembly 112. The main body portion 111 has a central region $111a$ for supporting the substrate W and an annular region $111b$ for supporting the ring assembly 112. The wafer is an example of the substrate W. The annular region $111b$ of the main body 111 surrounds the central region 111*a* of the main body 111 in a plan view. The substrate W is disposed on the central region 111*a* of the main body 111 and the ring assembly 112 is disposed on the annular region 111*b* of the main body 111 to surround the substrate W on the central region 111*a* of the main body 111. Accordingly, the central region 111*a* is also referred to as a substrate support surface for supporting the substrate W, and the annular region 111*b* is also referred to as a ring support surface for supporting the ring assembly 112.

In one embodiment, the main body 111 includes a base 1110 and an electrostatic chuck 1111. The base 1110 includes a conductive member. The conductive member of the base 1110 functions as a lower electrode. The electrostatic chuck 1111 is disposed on the base 1110. The electrostatic chuck 1111 includes a ceramic member 1111*a* and an electrostatic electrode 1111*b* disposed in the ceramic member 1111*a*. The ceramic member 1111*a* has a central region 111*a*. In one embodiment, the ceramic member 1111*a* also has an annular region 111*b*. Other members that surround the electrostatic chuck 1111, such as an annular electrostatic chuck and an annular insulating member, may have the annular region 111*b*. In this case, the ring assembly 112 may be disposed on the annular electrostatic chuck or the annular insulating member, or may be disposed on both the electrostatic chuck 1111 and the annular insulating member. Further, at least one RF/DC electrode coupled to a radio frequency (RF) power source 31 and/or a direct current (DC) power source 32 to be described below may be disposed inside the ceramic member 1111*a*. In this case, at least one RF/DC electrode functions as the lower electrode. In a case where the bias RF signal and/or the DC signal to be described later are supplied to at least one RF/DC electrode, the RF/DC electrode is also referred to as a bias electrode. The conductive member of the base 1110 and at least one RF/DC electrode may function as a plurality of lower electrodes. Further, the electrostatic electrode 1111*b* may function as the lower electrode. Accordingly, the substrate support 11 includes at least one lower electrode.

The ring assembly 112 includes one or more annular members. In one embodiment, one or more annular members include one or more edge rings and at least one cover ring. The edge ring is formed of a conductive material or an insulating material, and the cover ring is formed of an insulating material.

Further, the substrate support 11 may include a temperature control module configured to adjust at least one of the electrostatic chuck 1111, the ring assembly 112, and the substrate to a target temperature. The temperature control module may include a heater, a heat transfer medium, a flow path 1110*a*, or a combination thereof. A heat transfer fluid, such as brine or gas, flows through the flow path 1110*a*. In one embodiment, the flow path 1110*a* is formed inside the base 1110, and one or more heaters are disposed in the ceramic member 1111*a* of the electrostatic chuck 1111. Further, the substrate support 11 may include a heat transfer gas supply configured to supply a heat transfer gas to a gap between the rear surface of the substrate W and the central region 111*a*. The detail of the temperature control module is described in FIG. 4.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes at least one upper electrode. The gas introduction unit may include, in addition to the shower head 13, one or a plurality of side gas injectors (SGI) that are attached to one or a plurality of openings formed in the sidewall 10*a*.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include at least one flow rate modulation devices that modulate or pulse flow rates of at least one processing gas.

The power source 30 includes an RF power source 31 coupled to plasma processing chamber 10 via at least one impedance matching circuit. The RF power source 31 is configured to supply at least one RF signal (RF power) to at least one lower electrode and/or at least one upper electrode. As a result, plasma is formed from at least one processing gas supplied into the plasma processing space 10*s*. Accordingly, the RF power source 31 may function as at least a portion of the plasma generator 12. Further, by supplying the bias RF signal (bias signal) to the at least one lower electrode, a bias potential (bias power) is generated in the substrate W, making it possible to draw ion components in the formed plasma into the substrate W.

In one embodiment, the RF power source 31 includes a first RF generator 31*a* and a second RF generator 31*b*. The first RF generator 31*a* is configured to be coupled to at least one lower electrode and/or at least one upper electrode via at least one impedance matching circuit to generate a source RF signal (source RF power) for plasma generation. In one embodiment, the source RF signal has a frequency in the range of 10 MHz to 150 MHz. In one embodiment, the first RF generator 31*a* may be configured to generate a plurality of source RF signals having different frequencies. The generated one or more source RF signals are supplied to at least one lower electrode and/or at least one upper electrode.

The second RF generator 31*b* is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a lower frequency than the frequency of the source RF signal. In one embodiment, the bias RF signal has a frequency in the range of 100 kHz to 60 MHz. In one embodiment, the second RF generator 31*b* may be configured to generate a plurality of bias RF signals having different frequencies. The generated one or more bias RF signals are supplied to at least one lower electrode. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32*a* and a second DC generator 32*b*. In one embodiment, the first DC generator 32*a* is configured to be connected to at least one lower electrode to generate the first DC signal. The generated first DC signal is applied to at least one lower electrode. In one embodiment, the second DC generator 32*b* is configured to be connected to at least one upper electrode to generate a second DC signal. The generated second DC signal is applied to at least one upper electrode.

In various embodiments, at least one of the first and second DC signals may be pulsed. In this case, the sequence of voltage pulses is applied to at least one lower electrode and/or at least one upper electrode. The voltage pulse may have a pulse waveform of a rectangle, a trapezoid, a triangle or a combination thereof. In one embodiment, a waveform generator for generating a sequence of voltage pulses from the DC signal is connected between the first DC generator 32a and at least one lower electrode. Accordingly, the first DC generator 32a and the waveform generator configure a voltage pulse generator. In a case where the second DC generator 32b and the waveform generator configure the voltage pulse generator, the voltage pulse generator is connected to at least one upper electrode. The voltage pulse may have a positive polarity or a negative polarity. Further, the sequence of the voltage pulses may include one or more positive voltage pulses and one or more negative voltage pulses in one cycle. The first and second DC generators 32a and 32b may be provided in addition to the RF power source 31, and the first DC generator 32a may be provided instead of the second RF generator 31b.

The exhaust system 40 may be connected to, for example, a gas exhaust port 10e disposed at a bottom portion of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

The plasma processing apparatus 1 has an electromagnet assembly 3 including one or more electromagnets 45. The electromagnet assembly 3 is configured to generate a magnetic field in the chamber 10. In one embodiment, the plasma processing apparatus 1 comprises an electromagnet assembly 3 including a plurality of electromagnets 45. In the embodiment shown in FIG. 2a and/or FIG. 2b, the plurality of electromagnets 45 includes electromagnets 46-49. The plurality of electromagnets 45 are provided on or above the chamber 10. In other words, the electromagnet assembly 3 is located above or on top of the chamber 10. In the example shown in FIG. 2a and/or FIG. 2b, the plurality of electromagnets 45 are located on the shower head 13.

Each of the one or more electromagnets 45 includes a coil. In the example shown in FIG. 2a and/or FIG. 2b, electromagnets 46-49 include coils 61-64. The coils 61-64 are wound around a central axis Z. The central axis Z can be an axis passing through the center of the substrate W or the substrate support 11. In other words, in electromagnet assembly 3, the coils 61-61 can be cyclic coils. The coils 61-64 are coaxial about the central axis Z at the same height position.

The electromagnet assembly 3 further includes a bobbin 50 (or yoke). The coils 61-64 are wound around the bobbin 50 (or yoke). The bobbin 50 is formed, for example, from a magnetic material. The bobbin 50 has a columnar portion 51, a plurality of cylindrical portions 52-55, and a base portion 56. The base portion 56 has an approximate disk shape and its central axis line coincides with the central axis line Z. The columnar portion 51 and the plurality of cylindrical portions 52-55 extend downwardly from a lower surface of the base portion 56. The columnar portion 51 has an approximate cylindrical shape and its central axis line is coincident with the central axis line Z. The radius of the columnar portion 51 is, for example, 30 mm. The cylindrical portions 52-55 extend outside the columnar portion 51 in the radial direction with respect to the central axis line Z.

The coil 61 is wound along the outer circumference of the columnar portion 51 and is housed in the groove between the columnar portion 51 and the cylindrical portion 52. The coil 62 is wound along the outer circumference of the cylindrical portion 52 and is housed in the groove between the cylindrical portion 52 and the cylindrical portion 53. The coil 63 is wound along the outer circumference of the cylindrical portion 53 and is housed in the groove between the cylindrical portion 53 and the cylindrical portion 54. The coil 64 is wound along the outer circumference of the cylindrical portion 54 and is housed in the groove between the cylindrical portion 54 and the cylindrical portion 55.

A current source 65 is connected to each coil included in the one or more electromagnets 45. The supplying and stopping of the current, the direction of the current, and the value of the current from the current source 65 to each coil included in the one or more electromagnets 45 are controlled by the control unit 2. In addition, if the plasma processing apparatus 1 comprises a plurality of the electromagnets 45, the coils of the plurality of the electromagnets 45 may be connected to a single current source or may be connected to different current sources, respectively, from each other.

The one or more electromagnets 45 form a magnetic field in the chamber 10 that is axisymmetric with respect to the central axis line Z. By controlling the current supplied to each of the one or more electromagnets 45, it is possible to adjust the intensity distribution (or the magnetic flux density) of the magnetic field in the radial direction with respect to the central axis line Z. This allows the plasma processing apparatus 1 to adjust the radial distribution of the density of the plasma formed in the chamber 10.

Figure 3:
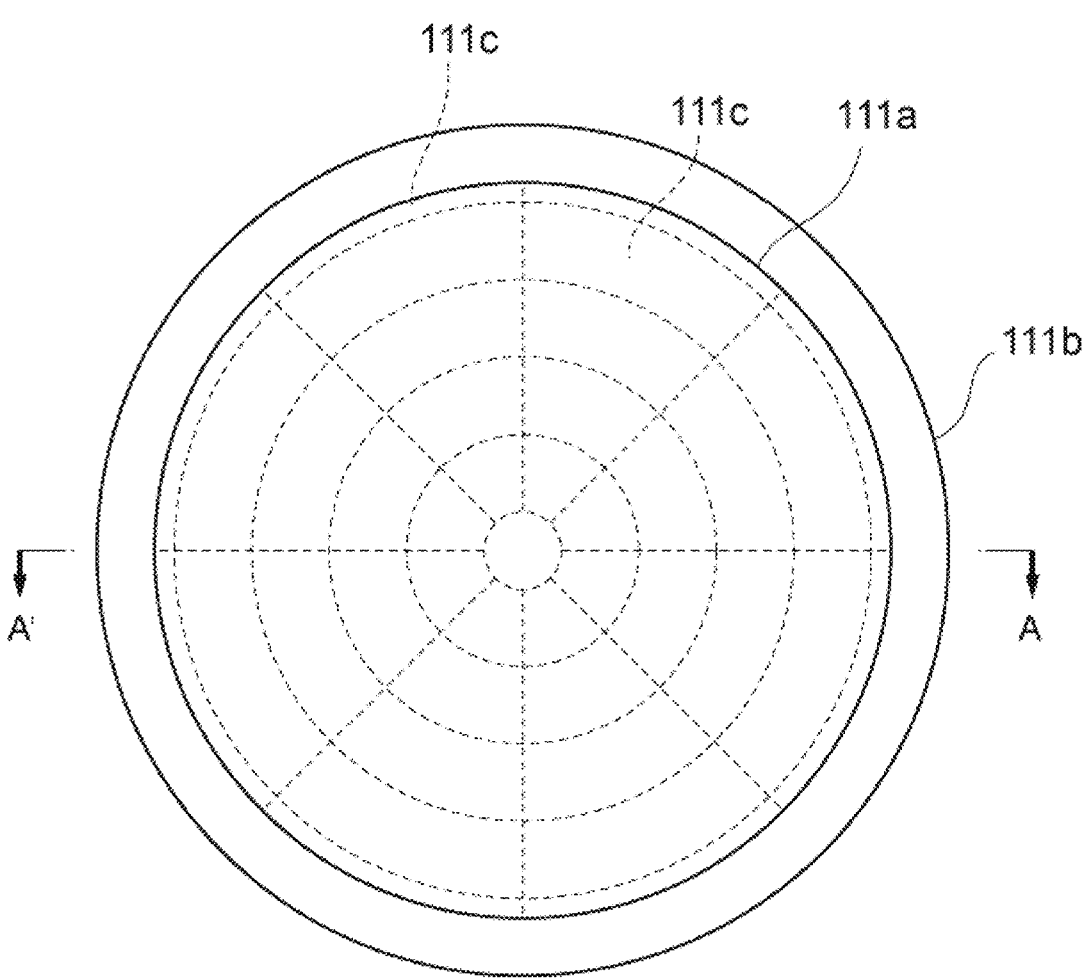
FIG. 3 shows an example of the top surface of the substrate support 11.

FIG. 3 shows an example of a top surface of the substrate support 11. As shown in FIG. 3, the substrate support 11 includes a central region 111a for supporting the substrate W and an annular region 111b for supporting the ring assembly 112. The central region 111a includes a plurality of zones 111c, as shown by dashed lines in FIG. 3. In this embodiment, the temperature control module can control the temperature of the substrate W or the substrate support 111c on a zone 111c basis. The number of zones 111c and the area and shape of each zone 111c may be set according to the conditions required in the temperature control of the substrate W.

Figure 4:
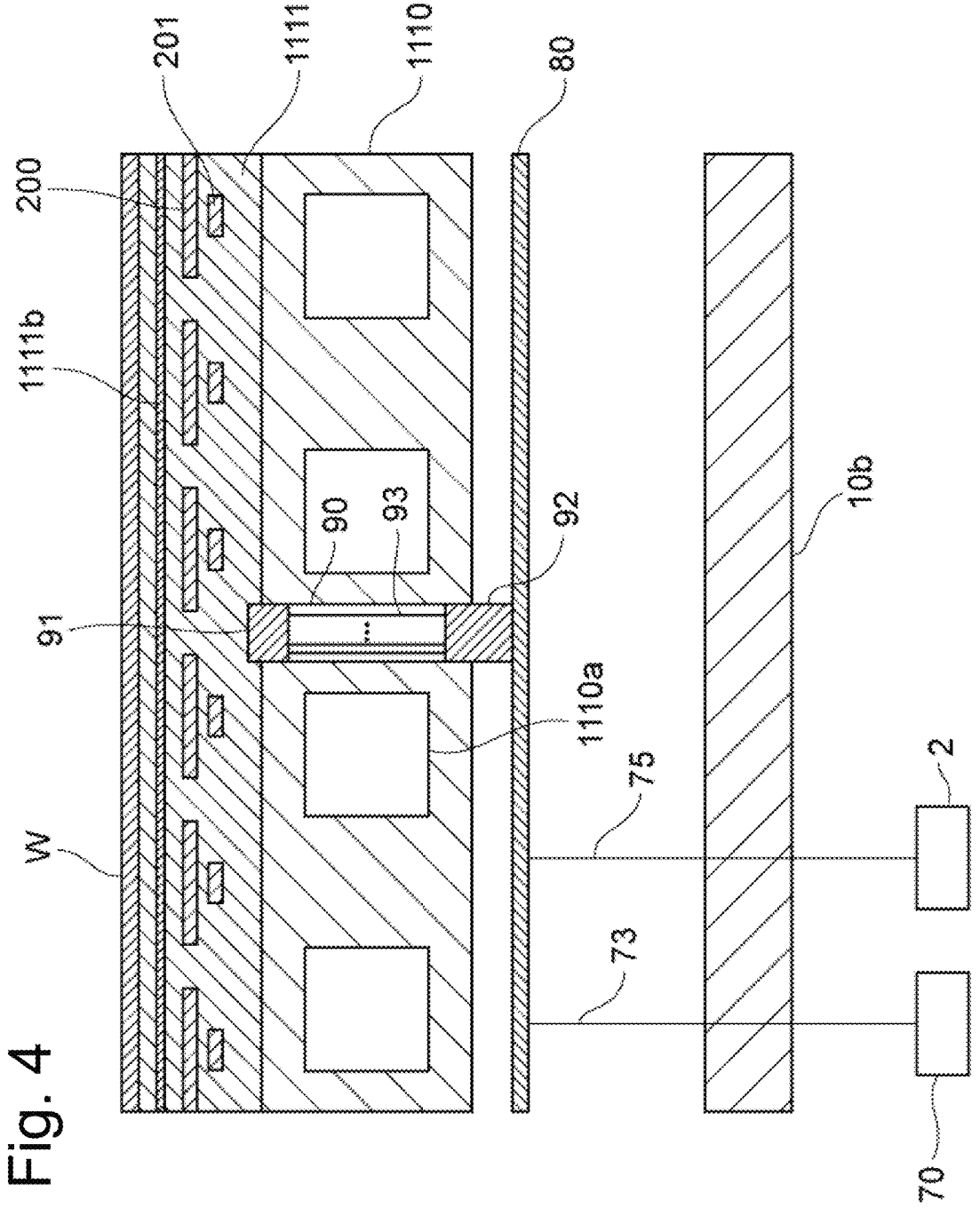
FIG. 4 shows an example of a cross-sectional view of the substrate support 11.

FIG. 4 shows an example of a cross-section of the substrate support 11. FIG. 4 shows a portion of the cross-section of the substrate support 11 at AA' in FIG. 3. As shown in FIG. 4, the substrate support 11 has the electrostatic chuck 1111, the base 1110, and the control substrate 80. The electrostatic chuck 1111 has a plurality of heaters 200 and a plurality of resistive elements 201 inside the electrostatic chuck 1111. In this embodiment, in each zone 111c shown in FIGS. 2a and 2b, one heater 200 and one resistive element 201 are located inside the electrostatic chuck 1111. In each zone 111c, the resistive element 201 is disposed near the heater 200. In one example, the resistive element 201 can be positioned between the heater 200 and the base 1110 and closer to the heater 200 than the base 1110. The resistive element 201 is configured such that its resistance varies with temperature. In one example, the resistive element 201 can be a thermistor.

The base 1110 has one or more through holes 90 that pass through the base 1110 from its top surface (the surface facing the electrostatic chuck 1111) to its bottom surface (the surface facing the control substrate 80). The plurality of heaters 200 and the plurality of resistive elements 201 can be electrically connected to the control board 80 through the through-holes 90. In this embodiment, a connector 91 is fitted at one end of the upper side of the through hole 90, and a connector 92 is fitted at one end of the lower side of the through hole 90. The plurality of heaters 200 and the plurality of resistive elements 201 are electrically connected to the connector 91. The plurality of heaters 200 and the plurality of resistive elements 201 may be connected to the connector 91, for example, via wiring arranged inside the electrostatic chuck 1111. The connector 92 is electrically connected to the control board 80. In the through hole 90, a plurality of wires 93 are arranged to electrically connect the connector 91 and the connector 92. Thereby, the plurality of heaters 200 and the plurality of resistive elements 201 can be electrically connected to the control board 80 via the through hole 90. The connector 92 may function as a support member to secure the control board 80 to the base 1110.

The control board 80 is a board on which the elements controlling the plurality of heaters 200 and/or the plurality of resistive elements 201 are arranged. The control board 80 can be positioned facing the under the lower surface of the base 1110 and parallel to the lower surface. The control board 80 may be arranged surrounded by conductor members. The control board 80 may be supported by the base 1110 with a support member other than the connector 92.

The control board 80 can be electrically connected to the power supply unit 70 via the wiring 73. In other words, the power supply unit 70 can be electrically connected to the plurality of heaters 200 via the control board 80. The power supply unit 70 generates power that is supplied to the plurality of heaters 200. Thereby, the power supplied from the power supply unit 70 to the control board 80 can be supplied to the plurality of heaters 200 via the connector 92, the wiring 93, and the connector 91. An RF filter that reduces RF may be placed between the power supply 70 and the control board 80. The RF filter may be provided outside the plasma processing chamber 10.

The control board 80 can be communicably connected to the control unit 2 via wiring 75. The wiring 75 can be an optical fiber. In this case, the control board 80 communicates with the control unit 2 with optical communication. The wiring 75 can also be metal wiring.

Figure 5:
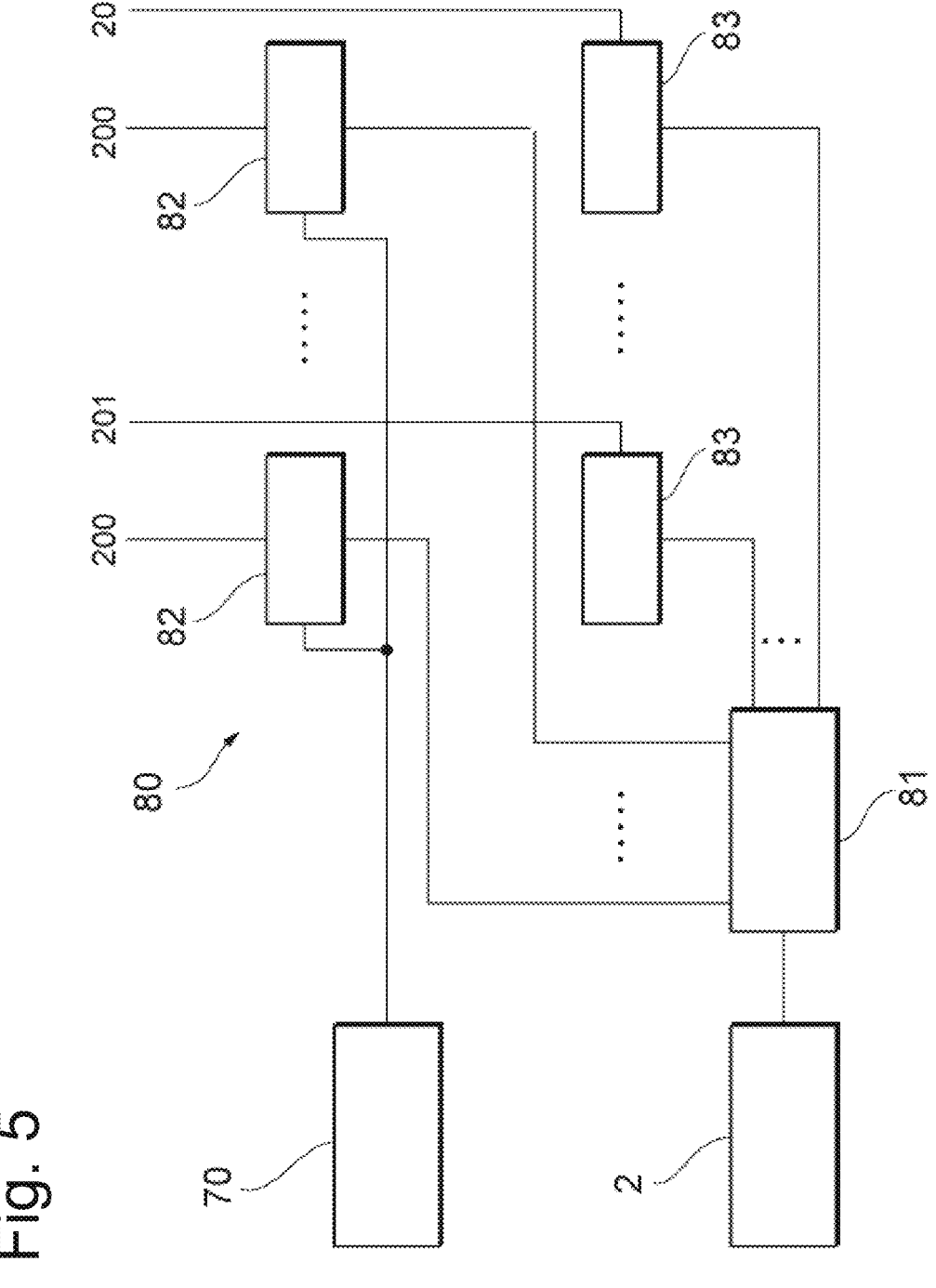
FIG. 5 shows a block diagram showing an example of the configuration of the control board 80.

FIG. 5 is a block diagram showing an example of the configuration of the control board 80. The control board 80 has a control unit 81, a plurality of supply units 82 and a plurality of measurement units 83 as examples of elements. The plurality of supply sections 82 and the plurality of measurement units 83 are provided corresponding to the plurality of heaters 200 and the plurality of resistive elements 201, respectively. One supply unit 82 and one measurement unit 83 may be provided for one heater 200 and one resistive element 201.

Each measurement unit 83 generates a voltage based on the resistance value of each resistive element 201 provided corresponding to each measurement unit 83 and supplies the voltage to control unit 81. The measurement unit 83 may be configured to convert the voltage generated based on the resistance value of the resistive element 201 into a digital signal and output the digital signal to the control unit 81.

The control unit 81 controls the temperature of the substrate W in each zone 111c. The control unit 81 controls the power supply to the plurality of heaters 200 based on the set temperature received from the control unit 2 and the voltage indicated by the digital signal received from the measuring unit 83. As an example, the control unit 81 controls the temperature of the resistive element 201 (hereinafter also referred to as the "measured temperature") based on the voltage indicated by the digital signal received from the measurement unit 83. The temperature of the resistor 201 is calculated. The control unit 81 then controls each of the supply units 82 based on the set temperature and the measured temperature. Each supply unit 82 switches whether or not to supply power supplied from the power supply unit 70 to each of the heaters 200 based on the control of the control unit 81. Each supply unit 82 may increase or decrease the power supplied from the power supply unit 70 and supply the power to each of the heaters 200 based on the control of controller 81. This allows the substrate W, the electrostatic chuck 1111 and/or the base 1110 to be brought to a predetermined temperature.

Example of a Detection Method

Figure 6:
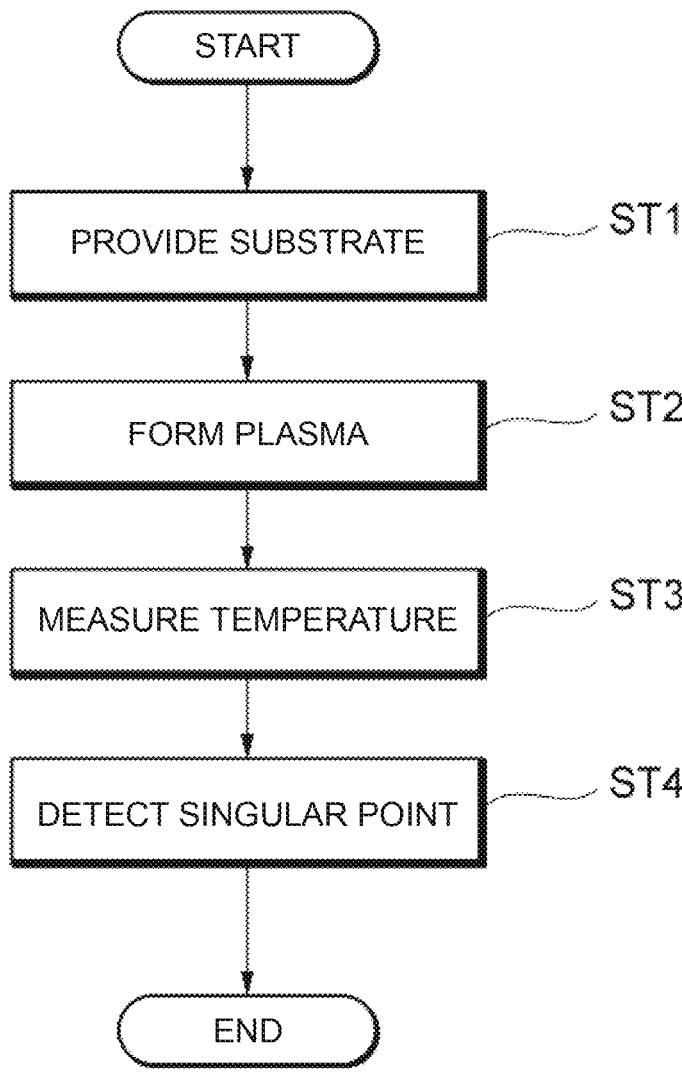
FIG. 6 shows a flowchart of a detection method according to one exemplary embodiment.

FIG. 6 shows a flowchart of one exemplary embodiment of a detection method (hereinafter referred to as "this detection method"). As shown in FIG. 6, the detection method includes the following steps of: placing the substrate W on the substrate support 11 (ST1), forming plasma in the plasma processing chamber 10 (ST2), measuring the temperature of each heater 200 (ST3), detecting singularities in the substrate W based on the measured temperature of each heater 200 (ST4). The processes in each step may be performed in the plasma processing system shown in FIG. 1. In the following, as an example, the control unit 2 controls each unit of the plasma processing apparatus 1 to perform this detection method.

(Step ST1: Placement of the Substrate)

In step ST1, a substrate W is placed on the substrate support 11. The substrate W placed on the substrate support 11 can be a dummy substrate, such as a silicon substrate, for example. The substrate W placed on the substrate support 11 can also be a substrate on which a portion of the semiconductor device has been formed (hereinafter also referred to as "process substrate"). The process substrate may include an etching film to be etched by plasma processing and a mask film disposed on the etching film. The mask film has a predetermined opening pattern.

The substrate W has a front surface and a back surface. In step ST1, the substrate W is placed on the substrate support 11 so that its back surface is in contact with the substrate support surface of the substrate support 11. When the substrate W is placed on the substrate support 11, a gap can be formed between the back surface of the substrate W and the substrate support surface. The gap can be grooves formed on the substrate support surface of the substrate support 11. The grooves can be formed to form a predetermined pattern on the substrate support surface.

Step ST1 may also include a step of controlling the temperature of the substrate W. In steps ST2 and ST3 described below, the control unit 2 may control the temperature of the plurality of heaters 200 so that the temperature of the substrate W remains approximately constant at the set temperature. Controlling the temperature of the substrate W to remain approximately constant will now be described.

Figure 7:
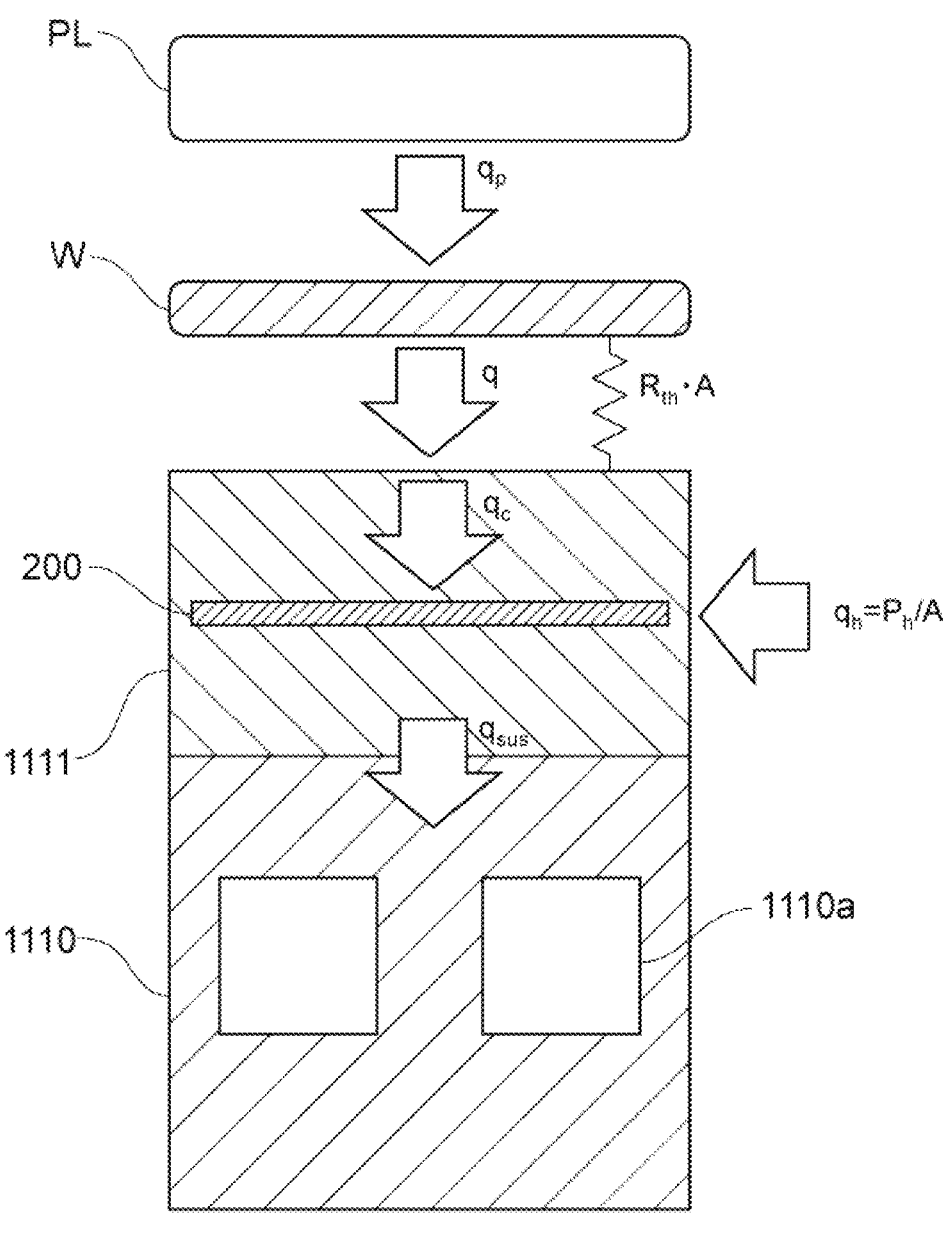
FIG. 7 shows a schematic diagram of the flow of energy.

FIG. 7 schematically illustrates the energy flow among the plasma PL, the substrate W, the substrate support 11 and the base 1110. The example shown in FIG. 7 illustrates the energy flow in one zone 111c of the substrate support 11. The substrate support 11 includes the electrostatic chuck 1111 and the base 1110. Inside the electrostatic chuck 1111 the heater 200 is disposed. Inside the base 1110, a channel 1110a is formed through which the heat transfer medium flows.

The temperature of heater 200 can vary depending on the power supplied by the power supply unit 70. In FIG. 7, the power supplied to heater 200 is shown as heater power Ph.

In the heater 200, a heat flux qh is generated in response to the heater power Ph. The heat flux qh is the amount of heat generation per unit area, which is the heater power Ph divided by the area A. The area A is the area of the heater 200 in the plan view of the substrate W.

When the plasma PL is being formed in the plasma processing chamber 10, the temperature of the substrate W can increase due to the heat transferred from the plasma PL to the substrate W. In FIG. 7, the heat flux qp from the plasma PL to the substrate W is shown as the heat flux per unit area, which is the amount of heat transferred from the plasma PL to the substrate W divided by the area of the substrate W.

Heat transferred from the plasma PL to the substrate W is transferred from the substrate W to the electrostatic chuck 1111. In FIG. 7, the thermal resistance per unit area between the substrate W and the electrostatic chuck 111*c* is shown as thermal resistance Rth·A. Here, A is the area of the zone 111*c* where the heater 200 is located. Rth is the thermal resistance of the zone 111*c* where the heater 200 is located. The amount of heat per unit area transferred from the substrate W to the electrostatic chuck 111*c* is shown as heat flux q.

Heat transferred from the substrate W to the surface of the electrostatic chuck 1111 is transferred from the surface of the electrostatic chuck 1111 to the heater 200. In FIG. 7, the amount of heat per unit area transferred from the surface of the electrostatic chuck 1111 to the heater 200 is shown as heat flux qc.

The base 1110 is cooled by the heat transfer gas flowing through the channel 1110*a* to cool the electrostatic chuck 1111. In FIG. 7, the heat flux per unit area is shown as qsus, which is transferred from the back surface of the electrostatic chuck 1111 to the base 1110. This can change the temperature of the heater 200 depending on the amount of heat transferred from outside the heater 200 to the heater 200 and from the heater 200 to outside the heater 200. For example, in the example shown in FIG. 7, if qh+qc>qsus, the temperature of heater 200 can increase. If qh+qc<qsus, the temperature of heater 200 can decrease.

When the temperature of the heater 200 is controlled to be constant, the sum of the amount of heat transferred from outside the heater 200 to the heater 200 and the amount of heat generation at the heater 200 can be equal to the amount of heat transferred from the heater 200 to outside the heater 200. For example, when the temperature of heater 200 is controlled to be constant, the amount of heat generation by the heater 200 and the amount of heat transferred from the heater 200 to the base 1110 can be equal without the plasma PL being formed. In other words, in the example shown in FIG. 7, it can be assumed that qh=qsus.

On the other hand, when the temperature of the heater 200 is controlled to be constant, for example, with the plasma PL being formed, the sum of the amount of heat transferred from outside the heater 200 to the heater 200 and the amount of heat generation by the heater 200 is equal to the amount of heat transferred from the heater 200 to the outside of the heater 200. Here, there are two states in which plasma PL is generated: a transient state and a steady state. The transient state is, for example, the state where qp>q>qc. In other words, it is a state in which the temperatures of the substrate W and the electrostatic chuck 111 increases over time due to the heat flux qp (this state is also referred to as a "transient state"). On the other hand, the steady state is, for example, a state in which qp=q=qc. In other words, it is a state in which the temperatures of the substrate W and the electrostatic chuck 111 do not increase over time due to the heat flux qp (this state is also referred to as the "steady state").

Figure 8:
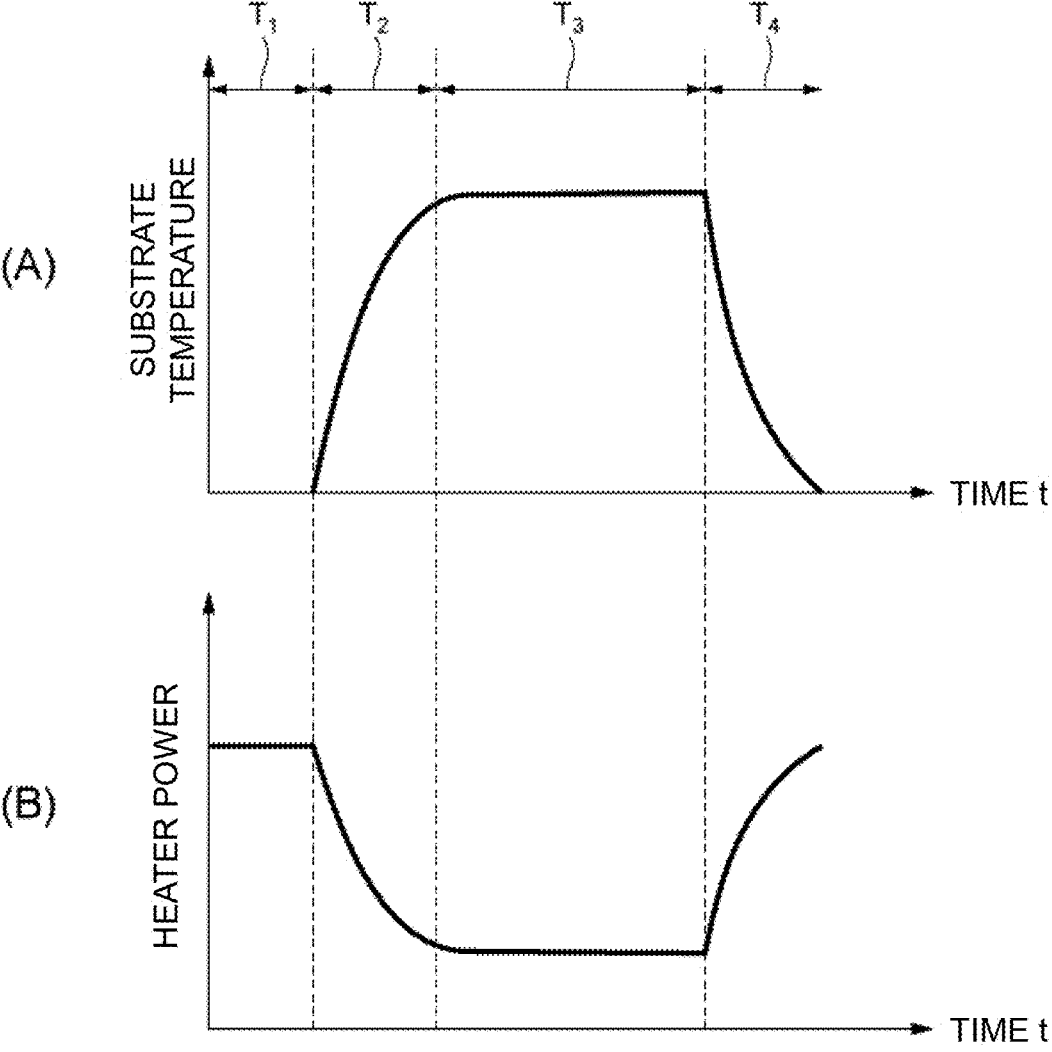
FIG. 8 shows an example of changes in the temperature of the substrate W and the power supplied to the heater 200.

FIG. 8 shows an example of changes in the temperature of the substrate W and the power supplied to the heater 200. (a) in FIG. 8 shows the change in temperature of the substrate W. (b) in FIG. 8 shows the change in the power supplied to the heater 200. In the example shown in FIG. 8, the temperature of the heater 200 is controlled to be constant. The example shown in FIG. 8 shows an example of the results of measuring the power supplied to the heater 200 to calculate the temperature of the substrate W over the state in which no plasma is formed to the state in which plasma is formed.

Period T1 in FIG. 8 is the period during which no plasma is formed. In period T1, the power supplied to heater 200 can be constant. Period T2 in FIG. 8 is a period during which a plasma is formed and is a transient state. In period T2, the power supplied to the heater 200 decreases over time. Also, in period T2, the temperature of the substrate W increases over time. Period T3 in FIG. 8 is the period during which a plasma is formed. In period T3, a steady state is reached and the temperature of the substrate W becomes constant. In period T3, the power supplied to the heater 200 is also approximately constant. Period T4 in FIG. 8 is a period during which no plasma is formed. In period T4, since the heat transferred from the plasma to the substrate W is reduced or eliminated, the temperature of the substrate W decreases while the power supplied to the heater 200 is increased.

The tendency of decrease in the power supplied to the heater 200 during the transient state shown in period T2 in FIG. 8 can vary depending on the amount of heat transferred from the plasma to the substrate W and/or the thermal resistance between the substrate W and the surface of the electrostatic chuck 1111.

When the temperature of the heater 200 is controlled to be constant, the heater power Ph varies with the heat flux qp from the plasma PL to the substrate W and the thermal resistance Rth·W between the substrate W and the surface of the electrostatic chuck 1111. For example, if the heat flux qp from the plasma PL to the substrate W increases in the transient state, the heater power Ph supplied to the heater 200 can decrease because the heat flux qp can increase the temperature of the substrate W.

When the temperature of the heater 200 is controlled to be constant, the change in the power supplied to the heater 200 in the transient state can be modeled as an expression for per unit area. For example, in the presence of the heat flux qp, the amount of heat qh per unit area of heater 200 can be expressed in Equation (1). FIG. 11 shows Equations (1) to (11). FIG. 12 shows Equation (12). FIG. 13 shows Equations (13).

Where,

Ph is the heater power [W] in the presence of heat flux qp.

Ph0 is the heater power [W] without heat flux qp and in steady state.

qh is the amount of heat generation per unit area of the heater 200 [W/m2] when there is a heat flux qp.

qh0 is the amount of heat generation per unit area [W/m2] of the heater 200 when there is no heat flux qp and in steady state.

qp is the heat flux per unit area from the plasma PL to the substrate W [W/m2].

Rth·A is the thermal resistance per unit area between the substrate W and the surface of the electrostatic chuck 1111 [K·m2/W].

Rthc·A is the thermal resistance per unit area [K·m2/W] between the surface of the electrostatic chuck 1111 and the heater 200.

A is the area [m2] of the zone $111c$ where the heater 200 is provided. ρw is the density of substrate W [kg/m3].

Cw is the heat capacity per unit area of the substrate W [J/K-m2].

zw is the thickness [m] of the substrate W.

ρc is the density [kg/m3] of the ceramic that constitutes the electrostatic chuck 1111.

Cc is the heat capacity per unit area [J/K-m2] of the ceramic comprising the electrostatic chuck 1111.

Zc is the distance [m] from the surface of the electrostatic chuck 1111 to the heater 200.

κc is the thermal conductivity [W/K-m] of the ceramic that constitutes the electrostatic chuck 1111.

t is the elapsed time [s] from the beginning of plasma formation.

The area A of the heater 200, the density ρw of the substrate W, the heat capacity Cw per unit area of the substrate W, the thickness zw of the substrate W, the density ρc of the ceramic that constitutes the electrostatic chuck 1111, the heat capacity Cc per unit area of the ceramic that constitutes the electrostatic chuck 1111, the distance zc from the surface of the electrostatic chuck 1111 to the heater 200, and the thermal conduction Kc are predetermined from the configurations of the substrate W and the plasma processing apparatus 1. Rthc·A is predetermined from the thermal conduction Kc and distance zc with Equation (4).

The heater power Ph and the heater power Ph0 can be obtained by the configuration shown in FIG. 5. The amount of heat generation per unit area of heater 200, qh and qh0, can be calculated from the heater power Ph, the heater power Ph0, and the area A, as shown in Equations (2) and (3).

The heat flux qp and thermal resistance Rth·A can then be obtained from the measured results of the heater power Ph and the heater power Ph0 and from Equation (1), for example, by means of fitting.

The graph of the temperature of the substrate W in period T2 shown in (a) of FIG. 8 can also be modeled with the heat flux qp and the thermal resistance Rth·A as parameters. In this embodiment, the temperature change per unit area of substrate W in period T2 can be modeled. In one example, using the heat flux qp and the thermal resistance Rth·A, as well as a1, a2, a3, λ1, λ2, τ1 and τ2 shown in Equations (5)-(11), the temperature TW [° C.] of the substrate W can be expressed in Equation (12).

Where,

TW is the temperature [° C.] of the substrate W.

Th is the temperature [° C.] of the heater 200 controlled at a constant level.

The temperature Th of the heater 200 can be determined from the actual conditions when the temperature of the substrate W is controlled at a constant level.

If the heat flux qp and the thermal resistance Rth·A are obtained by performing the fitting of Equation (1) using the measurement results, the temperature TW of the substrate W can be calculated from Equation (12).

When the elapsed time t is sufficiently longer than the time constants τ1 and τ2 expressed by formulas (10) and (11), for example, when calculating the temperature Th of the heater 200 at which the temperature TW of the substrate W becomes the target temperature after transition from the transient state, which is period τ2 in FIG. 8, to the steady state, which is period T3, then formula (12) can be omitted as Equation (13).

For example, the temperature TW of the substrate W can be obtained from the heater temperature Th, the heat flux qp, and the thermal resistances Rth·A and Rthc·A using Equation (13).

As described above, the thermal resistance between the substrate W and the electrostatic chuck 111 and the temperature of the substrate W can be obtained.

(Step ST2: Formation of Plasma)

In step ST2, a plasma is formed and a plasma processing is performed to the substrate W. Specifically, in step ST2, the processing gas is supplied into the plasma processing chamber 10. Also, a source RF signal is supplied to the top electrode or the bottom electrode. As a result, a plasma is formed from the processing gas in the plasma processing chamber 10. With the formed plasma, a plasma processing is performed to the substrate W supported by the substrate support 11. The plasma processing can be a plasma etching.

(Step ST3: Measurement of Temperature)

Figure 9:
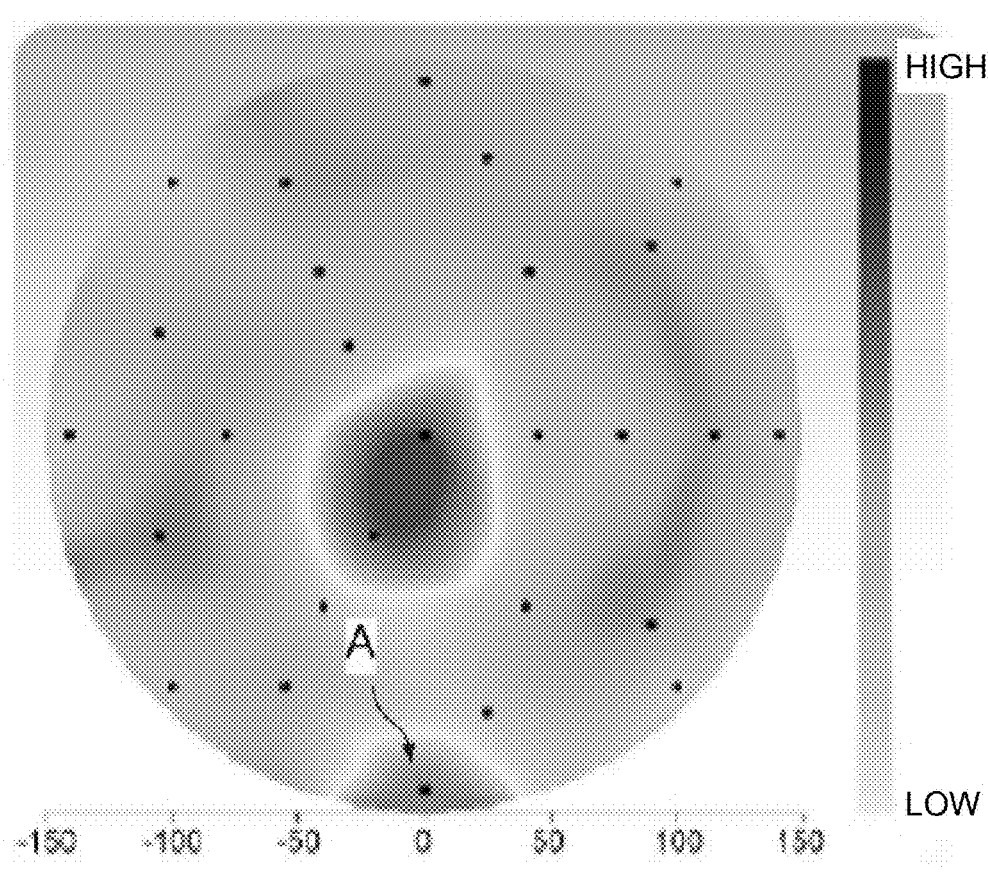
FIG. 9 shows an example of the temperature distribution of heater 200 in the substrate support surface of substrate support 11.

Next, in step ST3, the temperature of each heater 200 is measured. In one example, the temperature of each heater 200 can be measured with the resistive element 201 arranged corresponding to each heater 200. The temperature of each heater 200 may be measured continuously during and/or before and after the plasma process being performed. The control unit 2 may generate temperature distributions of the plurality of heaters 200 within the substrate support surface of the substrate support 11 based on the measured temperature of each heater 200. The control unit 2 may display the generated temperature distributions on a display device or the like to notify the user of the plasma processing apparatus 1. FIG. 9 shows an example of the temperature distribution of the heater 200 in the substrate support surface of the substrate support 11. The step ST3 may be performed in parallel with at least a part of step ST1 and/or at least a part of step ST2. Step ST3 may be continuously implemented during and/or before and after the plasma processing. In other words, the control unit 2 may continuously monitor the temperatures of the plurality of heaters 200 during and/or before and after performing the plasma processing.

(Step ST4: Detection of Singular Points)

Next, in step ST4, singular points in the substrate support 11 are detected. Singular points can be detected based on the temperature of one or more of the heaters 200 or the temperature distribution of the plurality of heaters 200. The singular point can be at a location on the substrate W, the substrate support 11 and/or the ring assembly 112. The singular point can also be a certain time or elapsed time during and/or before or after the plasma process being performed. The singular point may be determined by both the location and the time. The singular point can be the anomalous temperature location on the substrate support 11. The singular point can also be a part of the temperature anomaly. The anomalous location can be a local anomalous location. The singular point can be the time when the temperature showed an anomaly at the anomalous location.

The singular point may be detected based on a change in temperature over time at one or more of the plurality of heaters 200. In one example, if there is a temperature change at one or more of the heaters 200, such temperature change may be detected as a singular point. For example, the control unit 2 may store threshold values of temperature or temperature increase rate in advance for each heater 200. The control unit 2 may determine that a singular point has occurred when the temperature or temperature increase rate at a heater 200 exceeds the threshold value corresponding to that heater 200. The control unit 2 may also store reference temperature distributions for the plurality of heaters 200 in advance to detect singular points by comparing the reference temperature distributions with the measured temperature distributions of the heaters 200.

Singular points may be detected based on the location at which the plurality of heaters 200 are located. In one example, the singular point may be detected based on a measured temperature for one or more of the plurality of heaters 200 and a measured temperature for a different other heater 200 than said one or more heaters 200. For example, the control unit 2 may detect the location at or near which the different other heater 200 is located as a singular point if the temperature difference between the temperature of the one or more heaters 200 and the other heater 200 exceeds a predetermined temperature difference. The different other heater 200 may be a heater 200 adjacent to the one or more heaters 200, or may be a heater 200 located away from the one or more heaters 200. The control unit 2 may also store the reference temperature distributions of the plurality of heaters 200 in advance and detect singular points by comparing said reference temperature distributions with the measured temperature distributions of the heaters 200. As an example, the control unit 2 may detect the area indicated by A in FIG. 9 as a singular point.

In step ST4, the control unit 2 may associate the detected singular point with a parameter related to the plasma processing. The control unit 2 may notify the user of the plasma processing apparatus 1 of the detected singular point by associating the detected singular point with a parameter associated with the plasma processing. For example, the control unit 2 may notify the user of the plasma processing apparatus 1 by displaying the detected singular point on a display device or the like, associating the detected singular point with a parameter related to the plasma processing. As an example, the parameter related to plasma processing may be a leak of the heat transfer gas supplied to the backside of the substrate W. For example, if a singular point is detected in the temperature distribution of heaters 200 in step ST4 and it is determined that there is a leak of the heat transfer gas supplied to the backside of the substrate W, the control unit 2 may notify the user of the singular point by associating the singular point with the leak.

Figure 10A:
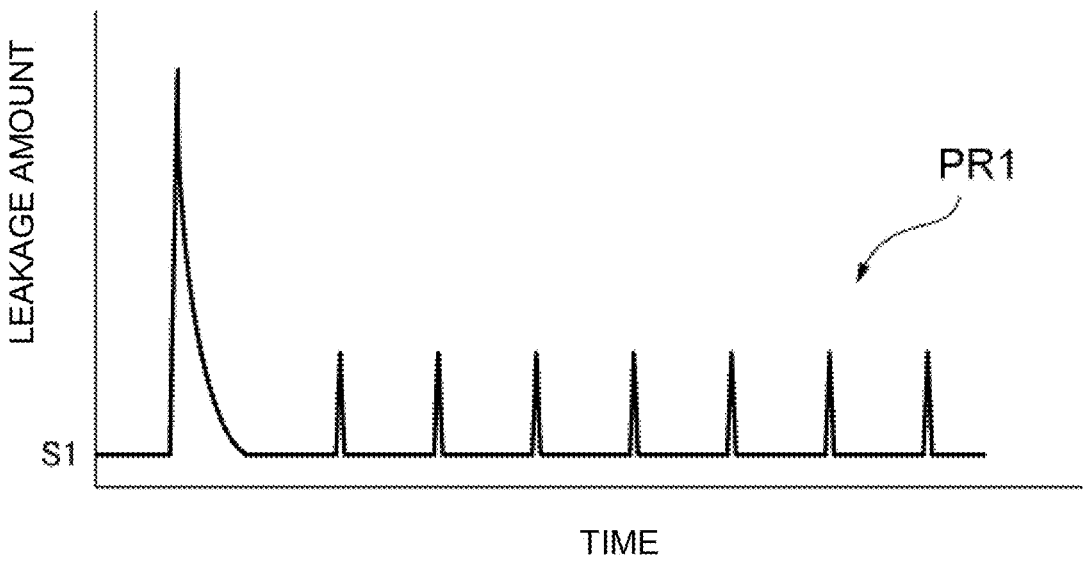
FIG. 10A shows a graph indicating an example of the amount of leakage of heat-transfer gas during plasma processing.
Figure 10B:
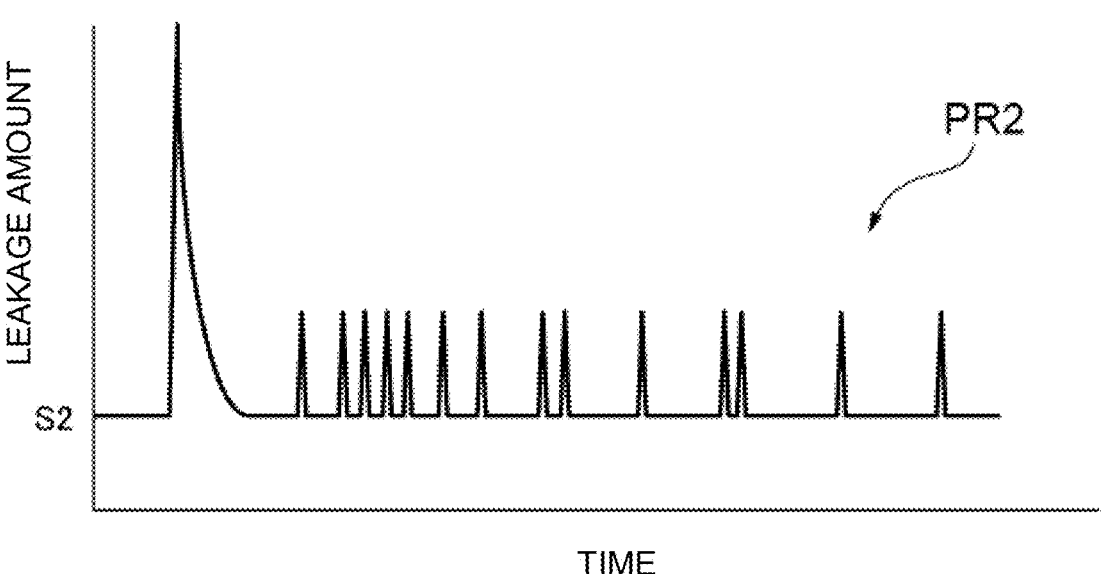
FIG. 10B shows a graph indicating an example of the leakage amount of the heat-transfer gas during plasma processing.

FIGS. 10A and 10B are graphs showing an example of the leakage amount of the heat transfer gas during plasma processing. The graph in FIG. 10A shows an example of a reference profile PR1 that is a reference for the leakage amount of the heat transfer gas during plasma processing. The reference profile PR1 can be a profile of the leakage amount of the heat transfer gas that occurs during plasma processing under normal conditions, such as after maintenance of the plasma processing apparatus 1. On the other hand, the graph in FIG. 10B shows an example of a profile PR2 that includes a singular point in the leakage amount of the heat transfer gas during plasma processing. In the graphs of FIGS. 10A and 10B, the horizontal axis indicates time and the vertical axis indicates the leakage amount of the heat transfer gas.

As shown in FIG. 10A, in the reference profile PR1, the leakage amount of the heat transfer gas is mostly S1. On the other hand, as shown in FIG. 10B, in profile PR2, the leakage amount of the heat transfer gas is mostly S2, which is larger than S1. Thus, the control unit 2 may store the leakage amount S1 in the reference profile PR1 or a leakage amount greater than S1 as a threshold value in advance, measure the leakage amount of the heat transfer gas during plasma processing, and determine that the measured leakage amount is singular if the measured leakage amount exceeds said threshold value. The control unit 2 may also determine that the measured leakage amount is singular based on the number and/or position (time) of the peaks of the leakage amount included in the measured profile PR2. In one example, the control unit 2 may determine that the measured leakage amount is singular by comparing the peaks of the leakage amount included in the measured profile PR2 with the peaks of the leakage amount included in the reference profile PR1. Said comparison may be a comparison of the number and/or location of the peaks of the leakage amount.

The parameters related to the plasma processing that the control unit 2 associates with the singular point in step ST4 may include parameters related to the source RF signal. As an example, the parameter related to the source RF signal may include the reflected power of the source RF signal at the electrode (the top electrode or the bottom electrode) to which the source RF signal is supplied. Also, as an example, the parameter with respect to the source RF signal may be the behavior of the voltage value of the source RF signal. The voltage value may be, for example, the difference (Vpp) between the maximum voltage and the minimum voltage of the source RF signal. When a singular point is detected in the temperature distribution of the heaters 200 in step ST4, the control unit 2 may notify the singular point in correspondence with the parameter regarding the source RF signal. As an example, when said singular point is the position of the lift pin in the substrate support 11, the control unit 2 may notify by associating said singular point with the parameter related to the source RF signal.

According to one exemplary embodiment of the present disclosure, a technique for detecting singular points while performing plasma processing can be provided.

According to an exemplary embodiment of the present disclosure, singular points in the temperature distribution of the heaters 200 arranged in the substrate support 11 can be detected. This makes it possible to identify the location of an anomaly in the substrate support 11 during plasma processing. As an example, the anomaly may be an electrical discharge that occurs in the heat transfer gas introduction hole in the substrate support 11 and/or in the pin hole where the lift pin is housed. The anomaly can also be a leak of heat transfer gas.

According to an exemplary embodiment of the present disclosure, it is possible to identify the occurrence time of singular points in the temperature distribution of the heaters 200 arranged in the substrate support 11. This facilitates identification of the cause of the occurrence of singular points during plasma processing.

According to an exemplary embodiment of the present disclosure, it is possible to detect temperature changes over time of the heaters 200 arranged in the substrate support 11. This makes it possible to identify in advance anomalies that may occur in the substrate support 11 during plasma processing.

The above embodiments are described for illustrative purposes, and various variations can be made without departing from the scope and purpose of the present disclosure. The present disclosure may include, for example, the following configurations.

Addendum 1

A detection method implemented in a plasma processing apparatus, the plasma processing apparatus comprising a plasma processing chamber, a substrate support disposed in the plasma processing chamber and a plurality of heaters disposed in the substrate support, the detection method comprising:

disposing a substrate on the substrate support;

performing plasma processing by generating plasma in the plasma processing chamber;

measuring temperatures of each of the plurality of heaters with a plasma being formed in the plasma processing chamber; and detecting a significant point in the substrate support based on the measured temperatures of the plurality of heaters.

Addendum 2

The detection method according to addendum 1 further comprises; notifying of the significant point.

Addendum 3

The detection method according to addendum 1 or 2 further comprises presetting a temperature threshold for each of the plurality of heaters, wherein, in detecting the significant point, the significant point is detected by comparing the measured temperature of each of the plurality of heaters with the threshold preset for each of the plurality of heaters.

Addendum 4

The detection method according to any one of addendums 1 to 3 further comprises associating the significant point with a parameter related to the plasma processing.

Addendum 5

The detection method according to any one of addendums 1 to 4, wherein the substrate has a front surface and a back surface, and in disposing the substrate, the substrate is disposed on the substrate support such that the back surface contacts the substrate support, the detection method further comprises:

supplying a heat transfer gas to a gap between back surface and the substrate support with the substrate being disposed on the substrate support; and measuring an amount of leakage of the heat transfer gas into the plasma processing chamber with the heat transfer gas being supplied.

Addendum 6

The detection method according to addendum 5, wherein associating includes associating the leak of the heat transfer gas with the significant point when the amount of leakage of the heat transfer gas exceeds a preset threshold.

Addendum 7

The detection method according to addendum 6, wherein associating the significant point with the parameter of the plasma processing includes notifying the association of the leak of the heat transfer gas with the significant point.

Addendum 8

The detection method according to any one of addendums 4 to 7, wherein performing plasma processing includes forming the plasma by supplying one or more RF signals to one or more electrodes, wherein, in associating the significant point with the parameter of the plasma processing, the parameter related to the plasma processing includes reflected power of the one or more RF signals reflected at the one or more electrodes.

Addendum 9

The detection method according to any one of addendums 4 to 8, wherein performing plasma processing includes forming a plasma by supplying one or more RF signals to one or more electrodes, wherein, in associating the significant point with the parameter of the plasma processing, the parameter related to the plasma processing includes a voltage of the one or more RF signals.

Addendum 10

The detection method according to addendum 9, wherein, in associating the significant point with the parameter of the plasma processing, the parameter related to the plasma processing includes a difference between a maximum voltage and a minimum voltage of the one or more RF signals.

Addendum 11

The detection method according to any one of addendums 8 to 10, wherein disposing the substrate includes disposing the substrate on the substrate support with a lift pin, and associating the significant point with the parameter of the plasma processing, the parameter related to the plasma processing includes notifying the association of a position of the lift pin with the significant point.

Addendum 12

The detection method according to any one of addendums 8 to 10, wherein the one or more of the RF signals include at least one of a source RF signal or a bias RF signal.

Addendum 13

The detection method according to any one of addendums 8 to 12, wherein the one or more electrodes include at least one of an upper electrode or a lower electrode.

Addendum 14

A plasma processing apparatus comprising:

a plasma processing chamber;

a substrate support disposed in the plasma processing chamber;

a plurality of heaters disposed in the substrate support; and a controller, wherein the controller executes controls of:

disposing a substrate on the substrate support;

performing plasma processing by generating plasma in the plasma processing chamber;

measuring temperatures of each of the plurality of heaters with a plasma being formed in the plasma processing chamber; and detecting a significant point in the substrate support based on the measured temperatures of the plurality of heaters.

What is claimed is:

1. A detection method implemented in a plasma processing apparatus, the plasma processing apparatus comprising a plasma processing chamber, a substrate support disposed in the plasma processing chamber and a plurality of heaters disposed in the substrate support, the detection method comprising:

disposing a substrate on the substrate support;

performing plasma processing by generating plasma in the plasma processing chamber;

measuring temperatures of each of the plurality of heaters with a plasma being formed in the plasma processing chamber;

detecting a significant point in the substrate support based on the measured temperatures of the plurality of heaters; and notifying a user of the plasma processing apparatus of the significant point.

2. The detection method according to claim 1 further comprises presetting a temperature threshold for each of the plurality of heaters, wherein, in detecting the significant point, the significant point is detected by comparing the measured temperature of each of the plurality of heaters with the threshold preset for each of the plurality of heaters.

3. The detection method according to claim 1 further comprises associating the significant point with a parameter related to the plasma processing.

4. The detection method according to claim 3, wherein the substrate has a front surface and a back surface, and in disposing the substrate, the substrate is disposed on the substrate support such that the back surface contacts the substrate support, the detection method further comprises:

supplying a heat transfer gas to a gap between back surface and the substrate support with the substrate being disposed on the substrate support;

measuring an amount of leakage of the heat transfer gas into the plasma processing chamber with the heat transfer gas being supplied; and associating leak of the heat transfer gas with the significant point.

5. The detection method according to claim 4, wherein associating includes associating the leak of the heat transfer gas with the significant point when the amount of leakage of the heat transfer gas exceeds a preset threshold.

6. The detection method according to claim 5, wherein associating the significant point with the parameter of the plasma processing includes notifying the association of the leak of the heat transfer gas with the significant point.

7. The detection method according to claim 3, wherein performing plasma processing includes forming the plasma by supplying one or more RF signals to one or more electrodes, wherein, in associating the significant point with the parameter of the plasma processing, the parameter related to the plasma processing includes reflected power of the one or more RF signals reflected at the one or more electrodes.

8. The detection method according to claim 3, wherein performing plasma processing includes forming a plasma by supplying one or more RF signals to one or more electrodes, wherein, in associating the significant point with the parameter of the plasma processing, the parameter related to the plasma processing includes a voltage of the one or more RF signals.

9. The detection method according to claim 8, wherein, in associating the significant point with the parameter of the plasma processing, the parameter related to the plasma processing includes a difference between a maximum voltage and a minimum voltage of the one or more RF signals.

10. The detection method according to claim 7, wherein disposing the substrate includes disposing the substrate on the substrate support with a lift pin, and associating the significant point with the parameter of the plasma processing, the parameter related to the plasma processing includes notifying the association of a position of the lift pin with the significant point.

11. The detection method according to claim 7, wherein the one or more RF signals include at least one of a source RF signal or a bias RF signal.

12. The detection method according to claim 11, wherein the one or more electrodes include at least one of an upper electrode or a lower electrode.

13. A plasma processing apparatus comprising:

a plasma processing chamber;

a substrate support disposed in the plasma processing chamber;

a plurality of heaters disposed in the substrate support; and a controller, wherein the controller executes controls of:

disposing a substrate on the substrate support;

performing plasma processing by generating plasma in the plasma processing chamber;

measuring temperatures of each of the plurality of heaters with a plasma being formed in the plasma processing chamber;

detecting a significant point in the substrate support based on the measured temperatures of the plurality of heaters; and notifying a user of the plasma processing apparatus of the significant point.

14. The detection method according to claim 8, wherein the one or more RF signals include at least one of a source RF signal or a bias RF signal.

15. The detection method according to claim 14, wherein the one or more electrodes include at least one of an upper electrode or a lower electrode.

* * * * *